(12) United States Patent
Do et al.

(10) Patent No.: US 7,414,310 B2
(45) Date of Patent: Aug. 19, 2008

(54) WAFERSCALE PACKAGE SYSTEM

(75) Inventors: Byung Tai Do, Singapore (SG); Sung Uk Yang, Singapore (SG)

(73) Assignee: Stats Chippac Ltd., Singapore (SG)

( * ) Notice: Subject to any disclaimer, the term of this patent is extended or adjusted under 35 U.S.C. 154(b) by 67 days.

(21) Appl. No.: 11/307,363

(22) Filed: Feb. 2, 2006

(65) Prior Publication Data

US 2007/0176280 A1    Aug. 2, 2007

(51) Int. Cl.
H01L 23/10    (2006.01)

(52) U.S. Cl. .................. 257/710; 257/704

(58) Field of Classification Search ............ 257/81, 257/99, 100, 432, 433, 704, 710, 173, E23.002
See application file for complete search history.

(56) References Cited

U.S. PATENT DOCUMENTS

| | | | | |
|---|---|---|---|---|
| 6,452,238 B1 * | 9/2002 | Orcutt et al. | ................ | 257/415 |
| 6,828,674 B2 * | 12/2004 | Karpman | ................ | 257/711 |
| 6,890,786 B2 | 5/2005 | Walker et al. | ................ | 438/48 |
| 6,911,727 B1 * | 6/2005 | Martin et al. | ................ | 257/704 |
| 6,953,985 B2 | 10/2005 | Lin et al. | ................ | 257/659 |
| 6,954,275 B2 | 10/2005 | Choi et al. | ................ | 356/614 |
| 6,960,971 B2 | 11/2005 | Park et al. | ................ | 333/262 |
| 7,202,552 B2 * | 4/2007 | Zhe et al. | ................ | 257/659 |
| 2002/0180032 A1 * | 12/2002 | Sun et al. | ................ | 257/704 |
| 2003/0036502 A1 * | 2/2003 | Gassner et al. | ................ | 514/2 |
| 2004/0016995 A1 * | 1/2004 | Kuo et al. | ................ | 257/678 |
| 2005/0202591 A1 * | 9/2005 | Chen et al. | ................ | 438/106 |
| 2005/0233492 A1 | 10/2005 | Ouellet et al. | ................ | 438/50 |
| 2006/0071324 A1 * | 4/2006 | Lu et al. | ................ | 257/704 |
| 2006/0105503 A1 * | 5/2006 | Ding et al. | ................ | 438/125 |
| 2006/0192281 A1 * | 8/2006 | Lu et al. | ................ | 257/704 |

* cited by examiner

Primary Examiner—S. V Clark
(74) Attorney, Agent, or Firm—Mikio Ishimaru

(57) ABSTRACT

A waferscale package system is provided forming a protection structure comprises forming a wafer, fabricating a device element on the wafer, forming a waferscale spacer around the device element, and attaching a waferscale cap to the waferscale spacer to cover the device element, attaching a carrier to the protection structure, and molding an encapsulant around the protection structure to the carrier.

20 Claims, 11 Drawing Sheets

WAFERSCALE PACKAGE SYSTEM

CROSS-REFERENCE TO RELATED APPLICATION(S)

The present application contains subject matter related to a copending U.S. patent application by Byung Tai Do and Sung Uk Yang entitled "INTEGRATED CIRCUIT SYSTEM WITH WAFERSCALE SPACER SYSTEM". The related application is assigned to STATS ChipPAC Ltd., identified by Ser. No. 11/307,317, and is herein incorporated by reference in its entirety.

TECHNICAL FIELD

The present invention relates generally to microelectromechanical systems (MEMS) and optics package structure and more particularly to packages using a waferscale spacer.

BACKGROUND ART

Requirements of modern electronics, such as cellular telephones or medical devices, demand more functions packed into a product while paradoxically providing less physical space in the system for the increased content. Continuous cost reduction is another requirement. Some technologies primarily focus on integrating more functions into each integrated circuit or stacking these integrated circuits into a single package. Other technologies provide different functions, such as optical or microelectromechanical, than conventional integrated circuits. While these technology approaches provide different form functional solutions, they do not address the requirements for cost reduction.

One proven way to reduce cost is to use mature package technologies with existing manufacturing methods and equipments, or in some cases eliminate some of the existing steps and equipments. Paradoxically, the reuse of existing manufacturing processes does not provide a robust and reliable packaging solution for microelectromechanical systems (MEMS) or for optics. Still the demand continues for lower cost, smaller size, and more functionality.

MEMS take the advantage of the silicon's mechanical properties or both mechanical and electrical properties. MEMS are actual mechanical systems that are created via a process called micro machining. Micro machining allows a two-dimensional or three-dimensional mechanical system to be created in a similar area that a typical integrated circuit would use. MEMS comprise mechanical structures, such as microactuators, microsensors, and microelectronics, integrated into a chip.

The diverse nature of MEMS technology complicates packaging to the extent that the packaging and testing cost may reach as high as 90% of the MEMS total fabrication cost. MEMS device packages may contain many electrical and/or mechanical components. The differences of MEMS from conventional semiconductors include the surface of the MEMS device must be free to allow mechanical movement and is very sensitive to mechanical damage as well as to damage from particle contamination.

Protection is a key element in packaging MEMS because ingress of moisture or contamination can prevent the devices from working. A used protection method in MEMS packaging is to use ceramic, metal or plastic lid or silicon cover or glass, which must be accompanied by special features like an epoxy dam to lift the cap or cover up from the die surface. The epoxy dam and other approaches are processing steps that differ from the high volume, low cost integrated circuit and packaging manufacturing processes. These differences are challenges to reduce cost of manufacturing and packaging MEMS devices.

Thus, a need still remains for a robust and reliable packaging solution for MEMS devices providing low cost manufacturing as well as reduce the package height. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides forming a protection structure comprises forming a wafer, fabricating a device element on the wafer, forming a waferscale spacer around the device element, and attaching a waferscale cap to the waferscale spacer to cover the device element, attaching a carrier to the protection structure, and molding an encapsulant around the protection structure to the carrier.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
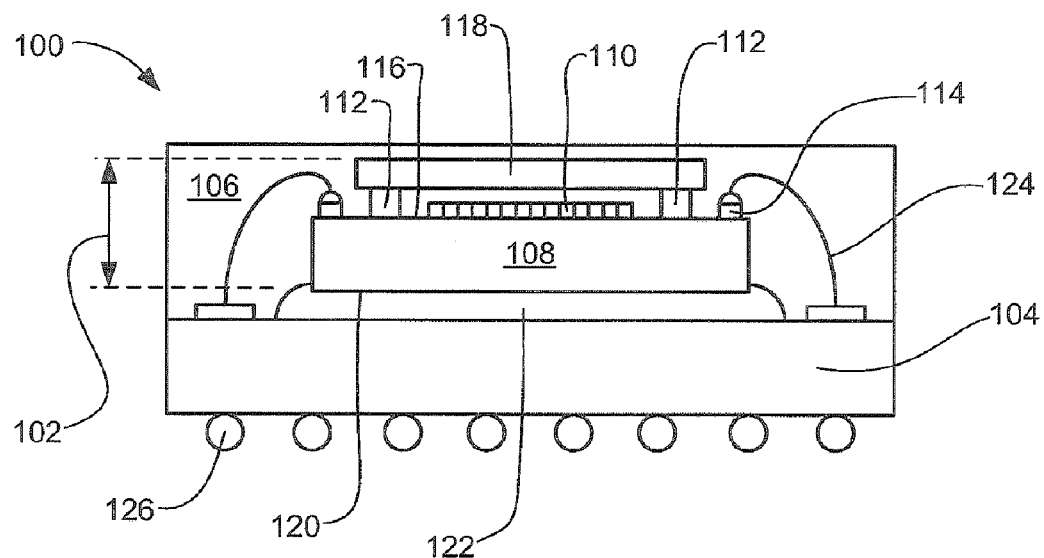
FIG. 1 is a cross-sectional view of a first waferscale package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional wafer surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

The term "waferscale" as used herein includes structures the size of a silicon wafer in which and upon which integrated circuits and micro electronic machines are formed. Waferscale structures are characterized by having sharp, about 90°, corners for submicron-sized structures.

Referring now to FIG. 1, therein is shown a cross-sectional view of a first waferscale package system 100 in an embodiment of the present invention. The first waferscale package system 100 includes a first protection structure 102 on a first carrier 104, such as a substrate, and hermetically sealed with an encapsulant 106.

The first protection structure 102 includes a first semiconductor die 108 having a first device element 110, such as a microelectromechanical system (MEMS) element or an optical element, a first waferscale spacer 112, such as a dam type, and bonding pads 114 on a first active side 116 of the first semiconductor die 108. The first semiconductor die 108 represents a wafer of which it is a part before singulation. The first device element 110 may be to any movable structural elements, such as gears, pivots, hinges, levers, or sliders. The first semiconductor die 108 may include a number of structures, such as integrated circuitry or other MEMS.

The first waferscale spacer 112 encloses the first device element 110 and has a vertical thickness greater its horizontal width and greater than the vertical thickness of the device element 110. A first cap 118 attaches to a top of the first waferscale spacer 112 and covers the first device element 110, wherein the first cap 118 may be a number of material, such as glass, ceramic, metal, plastic or any other organic or inorganic material. The first cap 118 and the first waferscale spacer 112 form a cavity and protect the first device element 110 from the encapsulation pressure as well as the outer environmental or thermomechanical stress. The cavity is a vacuum that is hermetically sealed. The first waferscale spacer 112 is shown as a dam type structure preventing the encapsulant 106 from interfering with the device element 110 from the sides of the cavity. The encapsulant 106 hermetically seals the first protection structure 102 and the first carrier 104 protecting the first device element 110 as well as other structures on the first semiconductor die 108. Moisture or contaminants may corrode or impede movement of the first device element 110 as well as damage other structures in the first waferscale package system 100.

A first non-active side 120 of the first semiconductor die 108 attaches to the first carrier 104 with a first die-attach material 122, such as an adhesive film or paste. Electrical interconnects 124, such as bond wires, connect the first carrier 104 to the bonding 114 outside the first waferscale spacer 112. External interconnects 126, such as solder balls, attach to the first carrier 104 for connections to the next system level (not shown), such as a printed circuit board.

Figure 2:
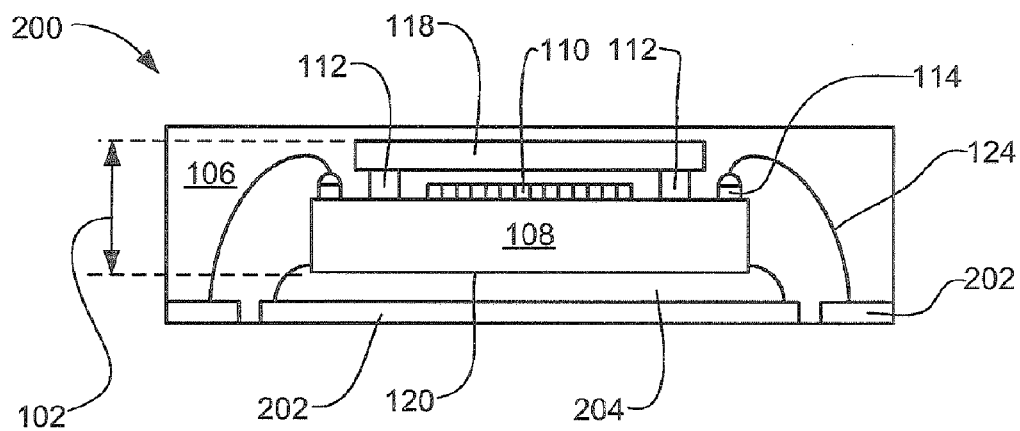
FIG. 2 is a cross-sectional view of a second waferscale package system in an alternative embodiment of the present invention.

Referring now to FIG. 2, therein is shown a cross-sectional view of a second waferscale package system 200 in an alternative embodiment of the present invention. Similarly, the second waferscale package system 200 includes the first protection structure 102. The first protection structure 102 includes the first semiconductor die 108 having the first device element 110, the first waferscale spacer 112, the first cap 118, and the bonding pads 114.

The first non-active side 120 attaches to a second carrier 202, such as a lead frame, with a second die-attach material 204, such as a thermally conductive adhesive. The electrical interconnects 124 connect the second carrier 202 to the bonding pads 114. The encapsulant 106 hermetically seals the first protection structure 102 and the second carrier 202 protecting the first device element 110 as well as other structures in the second waferscale package system 200. The second carrier 202 attaches to the next system level (not shown), such as a printed circuit board. The second carrier 202 may function as a heat sink.

For illustrative purposes, the first die-attach material 122 of FIG. 1 and the second die-attach material 204 are described as different, although it is understood that the first die-attach material 122 and the second die-attach material 204 may not be different, as well. Also for illustrative purpose, the first waferscale package system 100 of FIG. 1 and the second waferscale package system 200 are described utilizing the encapsulant 106, although it is understood that the first waferscale package system 100 and the second waferscale package system 200 may use different encapsulation material, as well. Further for illustrative purpose, the first waferscale package system 100 and the second waferscale package system 200 are described having the first protection structure 102 of FIG. 1, although it is understood that the first waferscale package system 100 and the second waferscale package system 200 may not have the first protection structure 102, as well.

Figure 3:
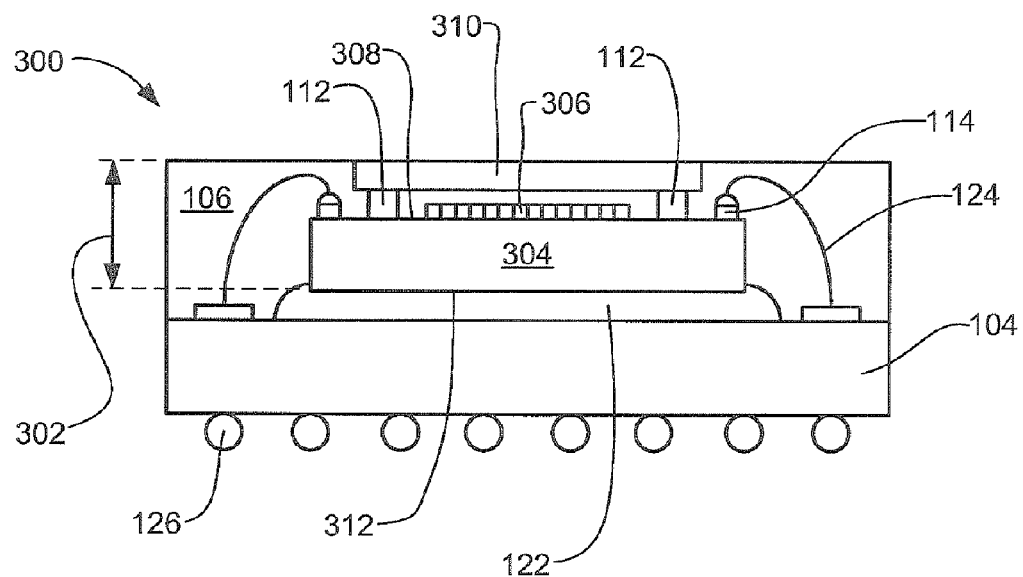
FIG. 3 is a cross-sectional view of a third waferscale package system in another alternative embodiment of the present invention.

Referring now to FIG. 3, therein is shown a cross-sectional view of a third waferscale package system 300 in another alternative embodiment of the present invention. The third waferscale package system 300 includes a second protection structure 302 on the first carrier 104, such as a substrate, and hermetically sealed with the encapsulant 106.

The second protection structure 302 includes a second semiconductor die 304 having a second device element 306, such as a microelectromechanical system (MEMS) element or an optical element, the first waferscale spacer 112, such as a dam type, and the bonding pads 114 on a second active side 308 of the second semiconductor die 304. The semiconductor die 304 represents a wafer of which it is a part before singulation. The second device element 306 may be to any MEMS active elements, such as flexible membranes for microsensors for chemical, pressure, and/or temperature microsensors. The second semiconductor die 304 may include a number of structures, such as integrated circuitry, optical structures, or other MEMS.

The first waferscale spacer 112 encloses the second device element 306. A second cap 310 attaches to a top of the first waferscale spacer 112 and covers the second device element 306, wherein the second cap 310 may be a number of material, such as glass, ceramic, metal, plastic or any other organic or inorganic material. The second cap 310 and the first waferscale spacer 112 form a cavity and protect the second device element 306 from the encapsulation pressure. The cavity may not be hermetically sealed, dependent on the application. The first waferscale spacer 112 is shown as a dam type structure preventing the encapsulant 106 from interfering with the device element 306 from the sides of the cavity.

The encapsulant 106 hermetically seals the second protection structure 302 and the first carrier 104 protecting the second device element 306 as well as other structures in the third waferscale package system 300. The encapsulant 106 leaves the top surface of the second cap 310 exposed. The second cap 310 may be substantially optically transparent allowing optical energy to be transmitted through the second cap 310 with minimal optical loss. The second cap 310 may be permeable to predetermined matter or sense predetermined conditions allowing the third waferscale package system 300 to function as a microsensor. The second semiconductor die 304 may provide an optical structure and function.

A second non-active side 312 of the second semiconductor die 304 attaches to the first carrier 104 with the first die-attach material 122. The electrical interconnects 124 connect the first carrier 104 to the bonding pads 114. The external interconnects 126 attach to the first carrier 104 for connections to the next system level (not shown), such as a printed circuit board.

For illustrative purposes, the first protection structure 102 of FIG. 1 and the second protection structure 302 are described as having different elements, although it is understood the elements of the first protection structure 102 and the second protection structure 302 may not have different elements, as well. Also for illustrative purpose, the first waferscale package system 100 of FIG. 1 and the third waferscale package system 300 are both shown with the first carrier 104, although it is understood the carrier may differ, as well.

Figure 4:
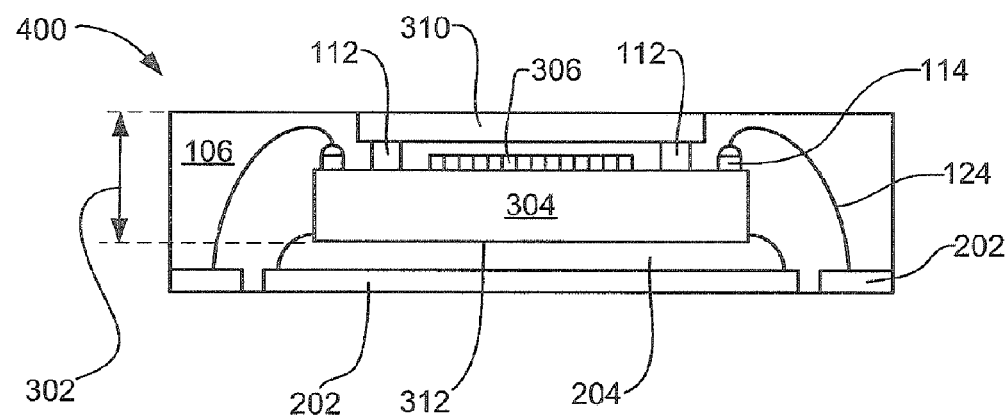
FIG. 4 is cross-sectional view of the fourth waferscale package system in yet another alternative embodiment of the present invention.

Referring now to FIG. 4, therein is shown a cross-sectional view of a fourth waferscale package system 400 in yet another alternative embodiment of the present invention. Similar to the third waferscale package system 300 of FIG. 3, the fourth waferscale package system 400 includes the second protection structure 302. The second protection structure 302 includes the second semiconductor die 304 having the second device element 306, the first waferscale spacer 112, the second cap 310, and the bonding pads 114.

The second non-active side 312 of the second semiconductor die 304 attaches to the second carrier 202 with the second die-attach material 204. The electrical interconnects 124 connect the second carrier 202 to the bonding pads 114. The encapsulant 106 hermetically seals the second protection structure 302 and the second carrier 202 protecting the second device element 306 as well as other structures in the fourth waferscale package system 400. The encapsulant 106 leaves the top surface of the second cap 310 exposed. The second carrier 202 attaches to the next system level (not shown), such as a printed circuit board. The second carrier 202 may function as a heat sink.

For illustrative purposes, the second waferscale package system 200 of FIG. 2 and the fourth waferscale package system 400 as described utilizing the second die-attach material 204, although it is understood that the second waferscale package system 200 and the fourth waferscale package system 400 may utilize different material for die attach, as well. Also for illustrative purpose, the second waferscale package system 200 and the fourth waferscale package system 400 are described utilizing the encapsulant 106, although it is understood that the second waferscale package system 200 and the fourth waferscale package system 400 may use different encapsulation materials, as well. Further for illustrative purpose, the third waferscale package system 300 of FIG. 3 and the fourth waferscale package system 400 are described having the second protection structure 302, although it is understood that the third waferscale package system 300 and the fourth waferscale package system 400 may not both have the second protection structure 302, as well.

Figure 5:
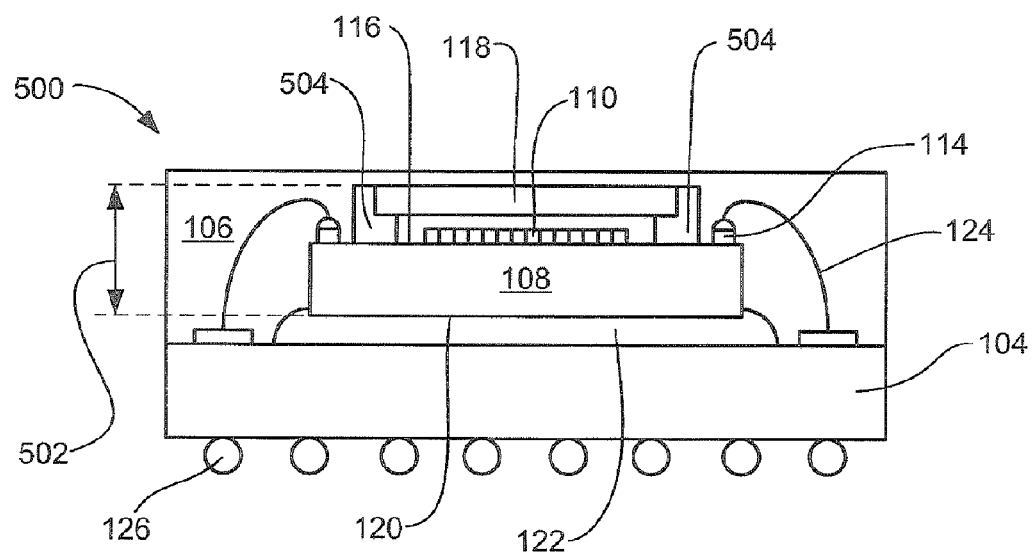
FIG. 5 is a cross-sectional view of a fifth waferscale package system in yet another alternative embodiment of the present invention.

Referring now to FIG. 5, therein is shown a cross-sectional view of a fifth waferscale package system 500 in yet another alternative embodiment of the present invention. The fifth waferscale package system 500 includes a third protection structure 502 on the first carrier 104 and hermetically sealed with the encapsulant 106.

The third protection structure 502 includes the first semiconductor die 108 having the first device element 110, a second waferscale spacer 504, such as a step-dam type, and the bonding pads 114 on the first active side 116 of the first semiconductor die 108. The step-dam spaces is defined as an annular ring spacer having an annular internal step formed inside the top for receiving a cap and acting to dam encapsulant from entering into the spacer, as typified by the second waferscale spacer 504 in FIG. 5. The first device element 110 may be to any movable structural elements, such as gears, pivots, hinges, levers, or sliders. The first semiconductor die 108 may include a number of structures, such as integrated circuitry or other MEMS.

The second waferscale spacer 504 encloses the first device element 110. The first cap 118 attaches within the second waferscale spacer 504 and on top of the step of the second waferscale spacer 504 and covers the first device element 110. The first cap 118 and the second waferscale spacer 504 form a cavity and protect the first device element 110 from the encapsulation pressure as well as the outer environmental or thermomechanical stress. The cavity is a vacuum that is hermetically sealed. The second waferscale spacer 504 is shown as a step-dam type structure preventing the encapsulant 106 from interfering with the device element 110 from the sides of the cavity and providing the step for the first cap 118. The encapsulant 106 hermetically seals the third protection structure 502 and the first carrier 104 protecting the first device element 110 as well as other structures on the first semiconductor die 108. Moisture or contaminants may corrode or impede movement of the first device element 110 as well as potentially damage other structures in the fifth waferscale package system 500.

The first non-active side 120 of the first semiconductor die 108 attaches to the first carrier 104 with the first die-attach material 122. The electrical interconnects 124 connect the first carrier 104 to the bonding pads 114. The external interconnects 126 attach to the first carrier 104 for connections to the next system level (not shown), such as a printed circuit board.

It has been discovered that the fifth waferscale package system 500 having the second waferscale spacer 504, the step-dam type waferscale spacer, reduces the total package height for use in thin and low profile applications. It has also been discovered that the second waferscale spacer 504 as the step-dam type forms a better effective seal due to the step structure.

For illustrative purpose, the first waferscale package system 100 of FIG. 1 and the fifth waferscale package system 500 as described as having the first cap 118, the first semiconductor die 108, and the first device element 110, although it is understood any of the listed elements may differ between the first waferscale package system 100 and the fifth waferscale package system 500, as well. Also for illustrative purpose, the first waferscale package system 100 and the fifth waferscale package system 500 are described as having the first carrier 104, and the first die-attach material 122, although it is understood any of the listed elements may differ between the first waferscale package system 100 and the fifth waferscale package system 500, as well.

Figure 6:
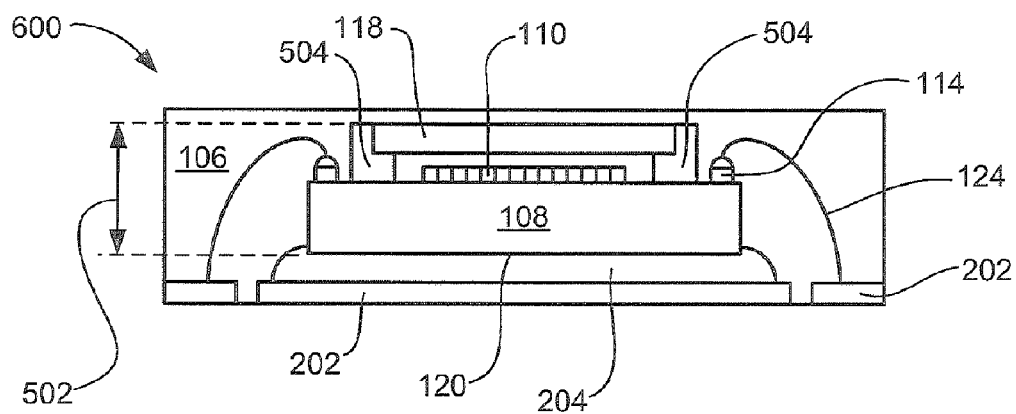
FIG. 6 is a cross-sectional view of a sixth waferscale package system in yet another alternative embodiment of the present invention.

Referring now to FIG. 6, therein is shown a cross-sectional view of a sixth waferscale package system 600 in yet another alternative embodiment of the present invention. Similar to the fifth waferscale package system 500 of FIG. 5, the sixth waferscale package system 600 includes the third protection structure 502. The third protection structure 502 includes the first semiconductor die 108 having the first device element 110, the second waferscale spacer 504, the first cap 118, and the bonding pads 114.

The first non-active side 120 of the first semiconductor die 108 attaches to the second carrier 202 with the second die-attach material 204. The electrical interconnects 124 connect the second carrier 202 to the bonding pads 114. The encapsulant 106 hermetically seals the third protection structure 502 and the second carrier 202 protecting the first device element 110 as well as other structures in the sixth waferscale package system 600. The second carrier 202 attaches to the next system level (not shown), such as a printed circuit board. The second carrier 202 may function as a heat sink.

Figure 7:
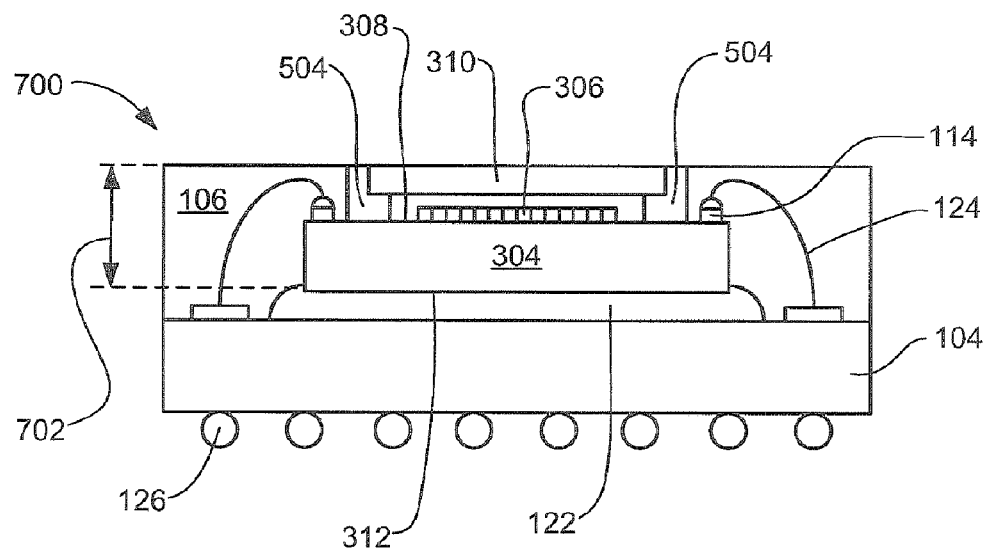
FIG. 7 is a cross-sectional view of a seventh waferscale package system in yet another embodiment of the present invention.

Referring now to FIG. 7, therein is shown a cross-sectional view of a seventh waferscale package system 700 in yet another embodiment of the present invention. The seventh waferscale package system 700 includes a fourth protection structure 702 on the first carrier 104 and hermetically sealed with the encapsulant 106.

The fourth protection structure 702 includes the second semiconductor die 304 having the second device element 306, the second waferscale spacer 504, and the bonding pads 114 on the second active side 308. The second device element 306 may be to any MEMS active elements, such as flexible membranes for microsensors for chemical, pressure, and/or temperature microsensors. The second semiconductor die 304 may include a number of structures, such as integrated circuitry, optical structures, or other MEMS.

The second waferscale spacer 504 encloses the second device element 306. The second cap 310 attaches within the second waferscale spacer 504 and on top of the step of the second waferscale spacer 504 and covers the second device element 306. The second cap 310 and the second waferscale spacer 504 form a cavity and protect the second device element 306 from the encapsulation pressure. The cavity may not be hermetically sealed, dependent on the application. The second waferscale spacer 504 is shown as a step-dam type structure preventing the encapsulant 106 from interfering with the device element 306 from the sides of the cavity and providing the step for the second cap 310.

The encapsulant 106 hermetically seals the fourth protection structure 702 and the first carrier 104 protecting the second device element 306 as well as other structures in the seventh waferscale package system 700. The encapsulant 106 leaves the top surface of the second cap 310 exposed. The second cap 310 may be substantially optically transparent allowing optical energy to be transmitted through the second cap 310 with minimal optical loss. The second cap 310 may be permeable to predetermined matter or sense predetermined conditions allowing the seventh waferscale package system 700 to function as a microsensor. The second semiconductor die 304 may provide an optical structure and function.

The second non-active side 312 of the second semiconductor die 304 attaches to the first carrier 104 with the first die-attach material 122. The electrical interconnects 124 connect the first carrier 104 to the bonding pads 114. The external interconnects 126 attaches to the first carrier 104 for connections to the next system level (not shown), such as a printed circuit board.

For illustrative purposes, the third protection structure 502 of FIG. 5 and the fourth protection structure 702 are described as having different elements, although it is understood the elements of the third protection structure 502 and the fourth protection structure 702 may not have different elements, as well. Also for illustrative purpose, the fifth waferscale package system 500 of FIG. 5 and the seventh waferscale package system 700 are both shown with the first carrier 104, although it is understood the carrier may differ, as well.

Figure 8:
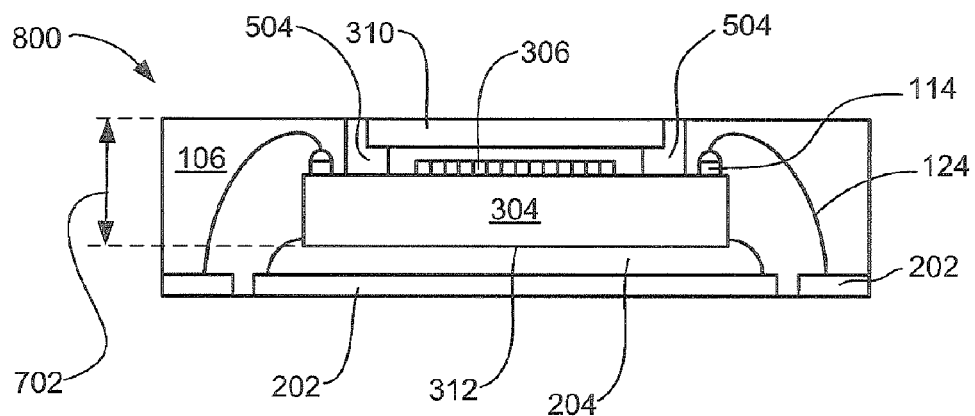
FIG. 8 is cross-sectional view of the eighth waferscale package system in yet another embodiment of the present invention.

Referring now to FIG. 8, therein is shown a cross-sectional view of an eighth waferscale package system 800 in yet another embodiment of the present invention. Similar to the seventh waferscale package system 700 of FIG. 7, the eighth waferscale package system 800 includes the fourth protection structure 702. The fourth protection structure 702 includes the second semiconductor die 304 having the second device element 306, the first waferscale spacer 112, the second cap 310, and the bonding pads 114.

The second non-active side 312 of the second semiconductor die 304 attaches to the second carrier 202 with the second die-attach material 204. The electrical interconnects 124 connect the second carrier 202 to the bonding pads 114. The encapsulant 106 hermetically seals the second protection structure 302 and the second carrier 202 protecting the second device element 306 as well as other structures in the eighth waferscale package system 800. The encapsulant 106 leaves the top surface of the second cap 310 exposed. The second carrier 202 attaches to the next system level (not shown), such as a printed circuit board. The second carrier 202 may function as a heat sink.

For illustrative purposes, the sixth waferscale package system 600 of FIG. 6 and the eighth waferscale package system 800 are described utilizing the second die-attach material 204, although it is understood that the sixth waferscale package system 600 and the eighth waferscale package system 800 may utilize different materials to die attach, as well. Also for illustrative purpose, the sixth waferscale package system 600 and the eighth waferscale package system 800 are described utilizing the encapsulant 106, although it is understood that the sixth waferscale package system 600 and the eighth waferscale package system 800 may use different encapsulation material, as well. Further for illustrative purpose, the seventh waferscale package system 700 of FIG. 7 and the eighth waferscale package system 800 are described having the second protection structure 302, although it is understood that the seventh waferscale package system 700 and the eighth waferscale package system 800 may not both have the second protection structure 302, as well.

Figure 9:
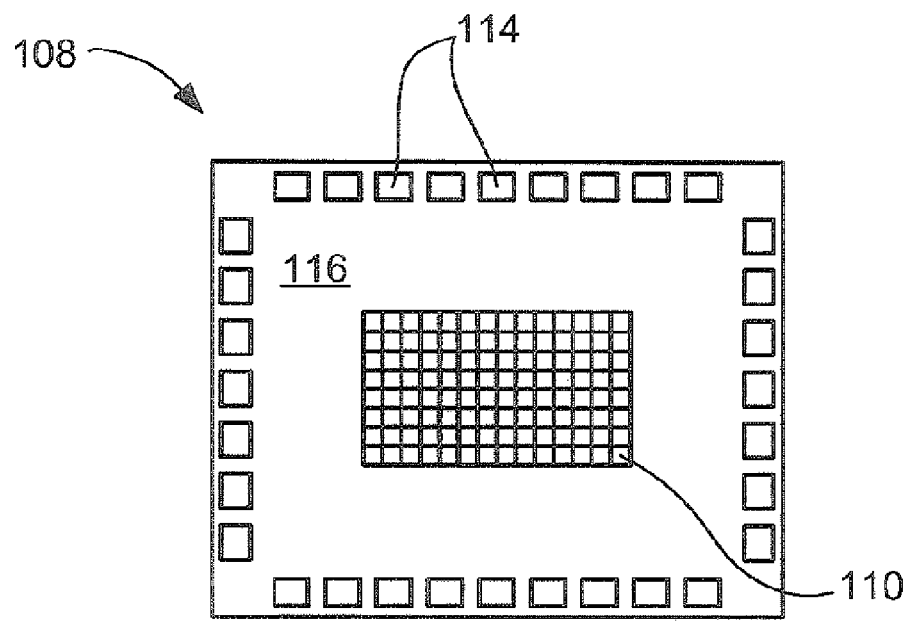
FIG. 9 is a top view of the first semiconductor die.

Referring now to FIG. 9, therein is shown a top view of the first semiconductor die 108. The top view depicts the first device element 110 fabricated on the first semiconductor die 108. The bonding pads 114 fabricated at the periphery of the first active side 116 at predetermined distances from the first device element 110. For example, the predetermined distances may be affected by the type of structure for protection of the first device element 110. The predetermined distances may also isolate or shield electromagnetic interaction between the first device element 110 and other structures on the first semiconductor die 108 or with the electrical signals on the bonding pads 114. For illustrative purpose, the first semiconductor die 108 is shown as singular, although it is understood that the first semiconductor die 108 may not be singulated, as well.

Figure 10:
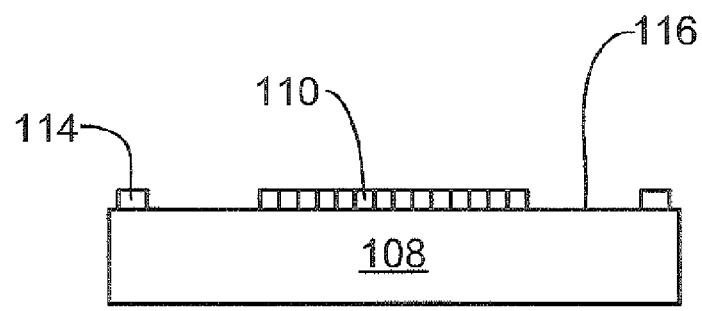
FIG. 10 is a cross-sectional view of the first semiconductor die.

Referring now to FIG. 10, therein is shown a cross-sectional view of the first semiconductor die 108. The cross-sectional view depicts the first device element 110 and the bonding pads 114 on the first active side 116. For illustrative purpose, the first semiconductor die 108 is shown as singular, although it is understood that the first semiconductor die 108 may not be singulated, as well.

Figure 11:
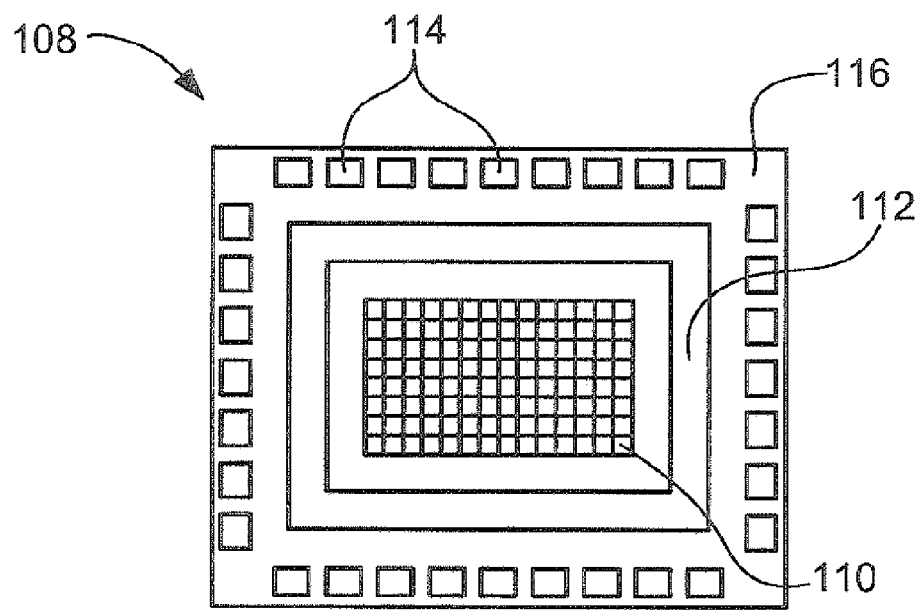
FIG. 11 is a top view of the first semiconductor die including the first waferscale spacer.

Referring now to FIG. 11, therein is shown a top view of the first semiconductor die 108 including the first waferscale spacer 112. The top view depicts the first waferscale spacer 112 between the first device element 110 and the bonding pads 114. The first waferscale spacer 112 encloses the first device element 110. The first waferscale spacer 112 provides predetermined distances to the first device element 110 as well as to the bonding pads 114. The first waferscale spacer 112 may be a number of materials, such as organic or inorganic material, as required. The first waferscale spacer 112 may provide electromagnetic shielding.

Figure 12:
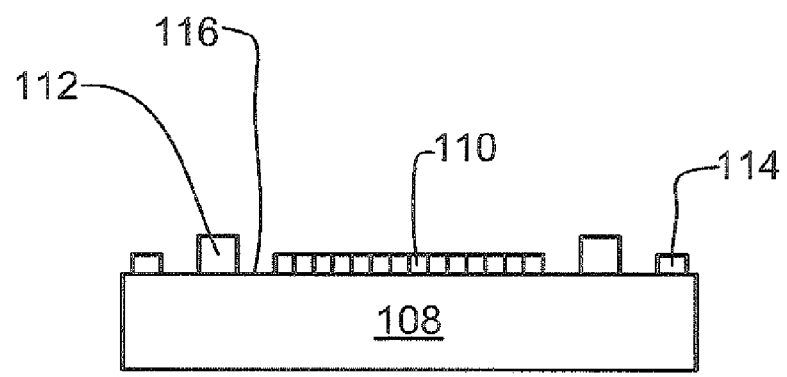
FIG. 12 is a cross-sectional view of the first semiconductor die including the first waferscale spacer.

Referring now to FIG. 12, therein is shown a cross-sectional view of the first semiconductor die 108 including the first waferscale spacer 112. The cross-sectional view depicts the first device element 110 and the bonding pads 114 on the first active side 116 of the first semiconductor die 108. The height of the first waferscale spacer 112 is higher than the height of the first device element 110, wherein the first waferscale spacer 112 provides a predetermined clearance for the first device element 110. For illustrative purpose, the first semiconductor die 108 is shown as singular, although it is understood that the first semiconductor die 108 may not be singulated, as well.

Figure 13:
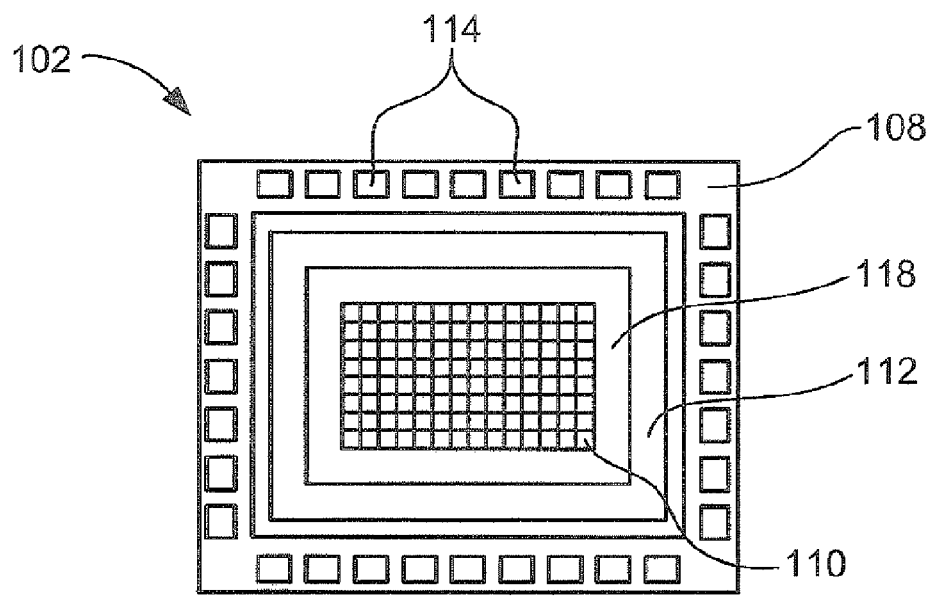
FIG. 13 is a plan view of the first protection structure.

Referring now to FIG. 13, therein is shown a plan view of the first protection structure 102. The plan view depicts the first semiconductor die 108, and the first waferscale spacer 112 between the first device element 110 and the bonding pads 114. The first cap 118 attaches to the first waferscale spacer 112 over the first device element 110 to form the first protection structure 102. The first cap 118 is made from a waferscale cap, wherein the waferscale cap attaches to a wafer forming the first semiconductor die 108.

Figure 14:
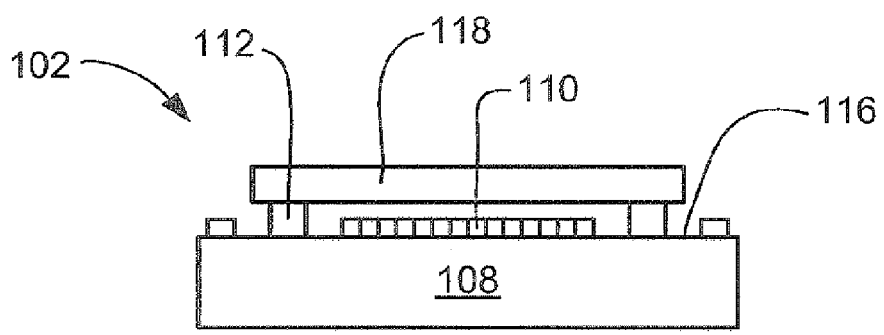
FIG. 14 is a cross-sectional view of the first protection structure.

Referring now to FIG. 14, therein is shown a cross-sectional view of the first protection structure 102. The cross-sectional view depicts the first device element 110 and the bonding pads on the first active side 116 of the first semiconductor die 108. The height of the first waferscale spacer 112 is higher than the height of the first device element 110 such that the first cap 118 on the first waferscale spacer 112 is over the first device element 110 with a predetermined clearance. For illustrative purpose, the first semiconductor die 108 is shown as singular, although it is understood that the first semiconductor die 108 may not be singulated, as well.

Figure 15:
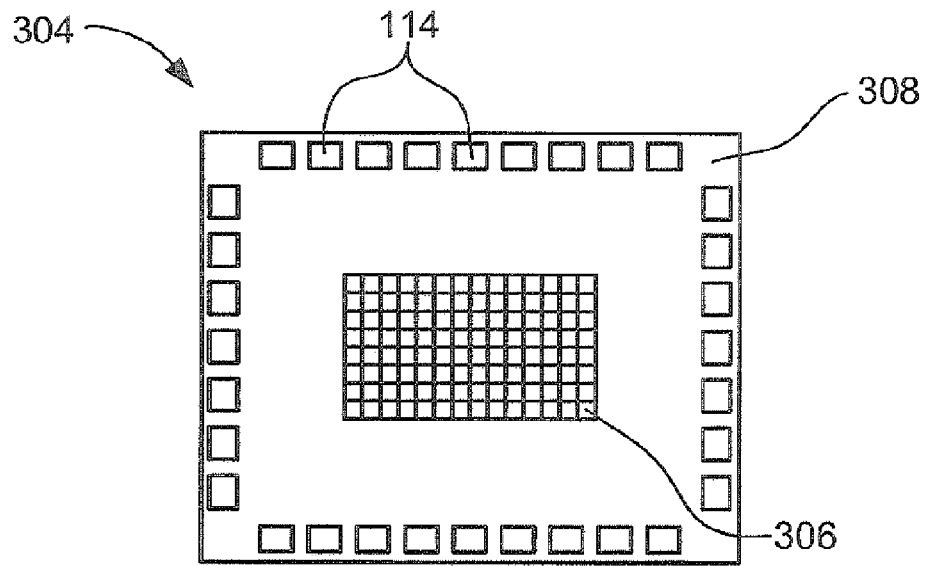
FIG. 15 is a top view of the second semiconductor die.

Referring now to FIG. 15, therein is shown a top view of the second semiconductor die 304. The top view depicts the second device element 306 fabricated on the second semiconductor die 304. The bonding pads 114 fabricated at the periphery of the second active side 308 at predetermined distances from the second device element 306. For example, the predetermined distance may be affected by the type of structure for protection of the second device element 306. The predetermined distance may also isolate or shield electromagnetic interaction between the second device element 306 and other structures on the second semiconductor die 304 or with the electrical signals on the bonding pads 114. For illustrative purpose, the second semiconductor die 304 is shown as singular, although it is understood that the second semiconductor die 304 may not be singulated, as well.

Figure 16:
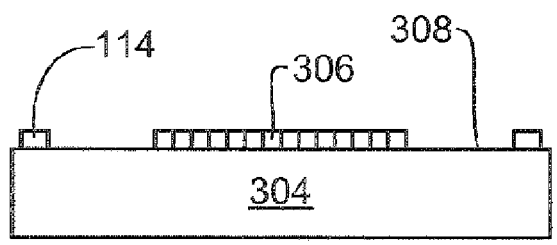
FIG. 16 is a cross-sectional view of the second semiconductor die.

Referring now to FIG. 16, therein is shown a cross-sectional view of the second semiconductor die 304. The cross-sectional view depicts the second device element 306 and the bonding pads 114 on the second active side 308 of the second semiconductor die 304. For illustrative purpose, the second semiconductor die 304 is shown as singular, although it is understood that the second semiconductor die 304 may not be singulated, as well.

Figure 17:
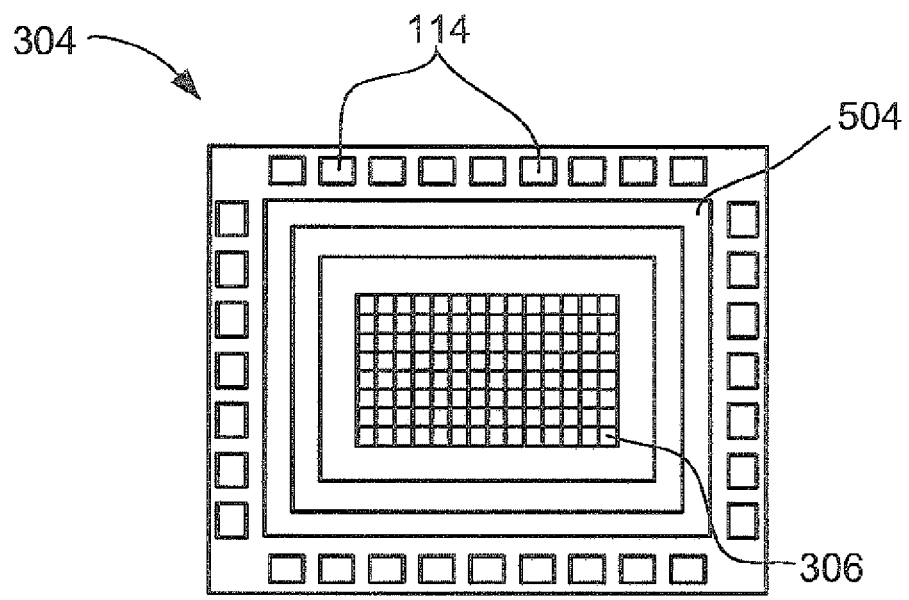
FIG. 17 is a top view of the second semiconductor die including the second waferscale spacer.

Referring now to FIG. 17, therein is shown a top view of the second semiconductor die 304 including the second waferscale spacer 504. The top view depicts the second waferscale spacer 504 between the second device element 306 and the bonding pads 114. The second waferscale spacer 504 encloses the second device element 306. The second waferscale spacer 504 provides predetermined distances to the second device element 306 as well as to the bonding pads 114. The second waferscale spacer 504 may be a number of materials, such as organic or inorganic material, as required. The second waferscale spacer 504 may provide electromagnetic shielding.

Figure 18:
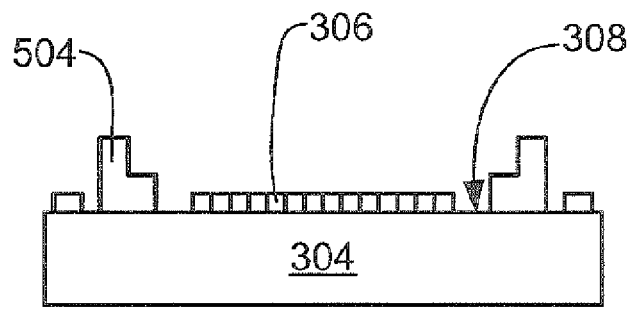
FIG. 18 is a cross-sectional view of the second semiconductor die including the second waferscale spacer.

Referring now to FIG. 18, therein is shown a cross-sectional view of the second semiconductor die 304 including the second waferscale spacer 504. The cross-sectional view depicts the second device element 306 and the bonding pads on the second active side 308 of the second semiconductor die 304. The height of the step of the second waferscale spacer 504 is higher than the height of the second device element 306, wherein the step of the second waferscale spacer 504 provides a predetermined clearance for the second device element 306. For illustrative purpose, the second semiconductor die 304 is shown as singular, although it is understood that the second semiconductor die 304 may not be singulated, as well.

Figure 19:
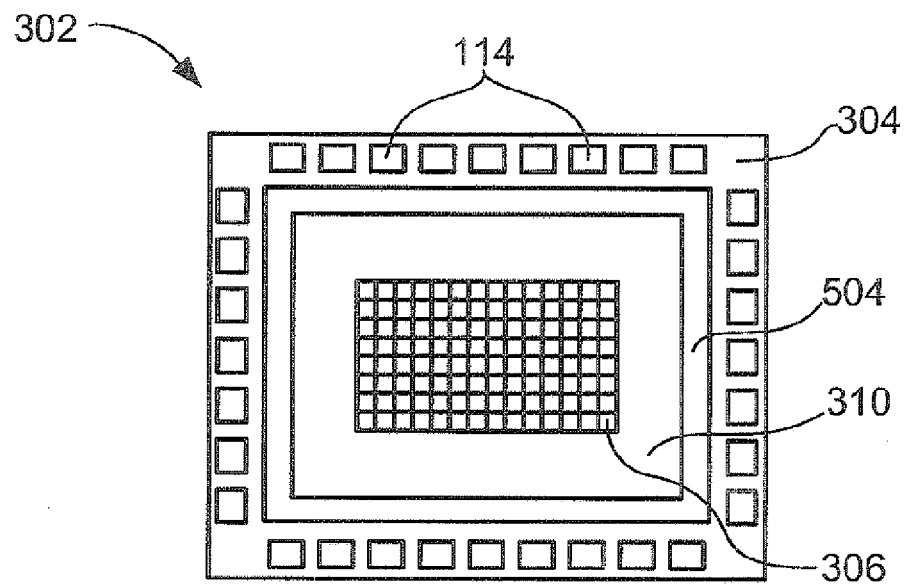
FIG. 19 is a plan view of the second protection structure.

Referring now to FIG. 19, therein is shown a plan view of the second protection structure 302. The plan view depicts the second semiconductor die 304, and the second waferscale spacer 504 between the second device element 306 and the bonding pads 114. The second cap 310 attaches on the step of the second waferscale spacer 504 over the second device element 306 to form the second protection structure 302. The second cap 310 is made from a waferscale cap, wherein the waferscale cap attaches to a wafer forming the second semiconductor die 304.

Figure 20:
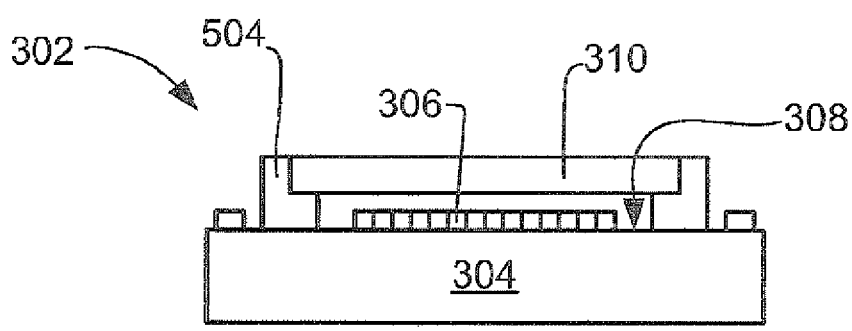
FIG. 20 is a cross-sectional view of the second protection structure.

Referring now to FIG. 20, therein is shown a cross-sectional view of the second protection structure 302. The cross-sectional view depicts the second device element 306 and the bonding pads on the second active side 308 of the second semiconductor die 304. The height of the step of the second waferscale spacer 504 is higher than the height of the second device element 306 such that the second cap 310 on the step of the second waferscale spacer 504 is over the second device element 306 with a predetermined clearance. For illustrative purpose, the second semiconductor die 304 is shown as singular, although it is understood that the second semiconductor die 304 may not be singulated, as well.

Figure 21:
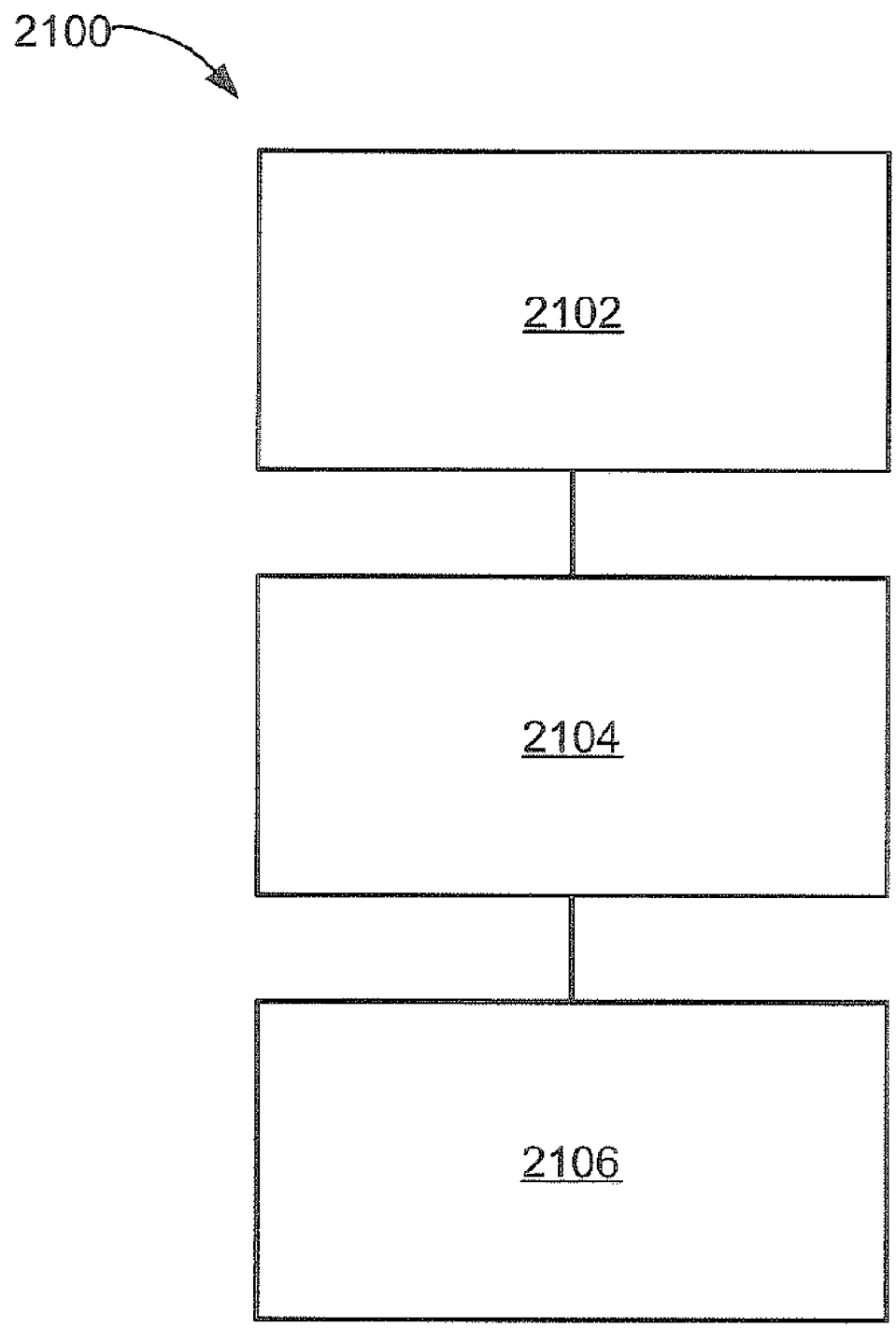
FIG. 21 is a flow chart of a waferscale package system for manufacturing the wafer scale spacer package in an embodiment of the present invention.

Referring now to FIG. 21, therein is shown a flow chart of a waferscale package system 2100 for manufacturing the wafer scale spacer package in an embodiment of the present invention. The system 2100 includes forming a protection structure comprises forming a wafer, fabricating a device element on the wafer, forming a waferscale spacer around the device element, and attaching a waferscale cap to the waferscale spacer to cover the device element in a block 2102; attaching a carrier to the protection structure in a block 2104; and molding an encapsulant around the protection structure to the carrier in a block 2106.

It has been discovered that the present invention thus has numerous aspects.

It has been discovered that waferscale cap provides most cost effective and reliable MEMS packaging solution and may be realized in all conventional package types. Conventional packages and waferscale spacer system provide the means to use more existing manufacturing processes and equipments leveraging the economy of scale and significantly reduce the overall fabrication cost.

An aspect is that the present invention is that the waferscale cap with the waferscale spacer form structures protecting the MEMS element, such as the MEMS sensitive area, for a number of different applications. Movable MEMS structures, such as gears, pivots, hinges, levers, or sliders, may be protected by selecting the appropriate material for the waferscale cap and additionally protected with hermetically seal by an encapsulant.

Another aspect of the present invention is that the waferscale cap with the waferscale spacer form structures protecting the MEMS element for yet other different applications. Active MEMS elements, such as flexible membranes for microsensors for chemical, pressure, and/or temperature microsensors, may be protected by selecting the appropriate material for the waferscale cap. The waferscale cap material may be permeable to predetermined matter or sensitive to predetermined conditions. The encapsulant hermetically seals and protects the active MEMS element while leaving the top surface of the waferscale cap exposed.

Yet another aspect of the present invention is that the waferscale cap with the waferscale spacer form structures may provide low cost packaging solutions for optical application. The waferscale cap may be of materials that transmit optical energy with minimal optical loss.

Yet another aspect of the present invention is that the waferscale cap and waferscale spacer may also provide electromagnetic shielding. This electromagnetic shielding isolates the MEMS element to other active structures or signals on the semiconductor die with the MEMS element.

Yet another aspect of the present invention is that the waferscale spacer may reduce the complexity and cost with dam type waferscale spacer "normal" application. The waferscale spacer may support mounting the waferscale cap for thin or low profile application with a step-dam type waferscale spacer.

Thus, it has been discovered that the waferscale cap system method of the present invention furnishes important and heretofore unknown and unavailable solutions, capabilities, and functional aspects of MEMS devices in systems. The resulting processes and configurations are straightforward, cost-effective, uncomplicated, highly versatile and effective, can be implemented by adapting known technologies, and are thus readily suited for efficiently and economically manufacturing stacked integrated circuit package-in-packaged devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A waferscale package system comprising:
   forming a protection structure comprises:
      forming a wafer,
      fabricating a device element on the wafer,
      forming a waferscale spacer around the device element and having a thickness greater than a width thereof and greater than the thickness of the device element, and
      attaching a waferscale cap to the waferscale spacer to cover the device element;
   attaching a carrier to the protection structure;
   electrically connecting the wafer outside the waferscale spacer to the carrier with bond wires; and
   molding an encapsulant around the protection structure to the carrier.

2. The system as claimed in claim 1 wherein fabricating the device element on the wafer comprises fabricating a microelectromechanical system element.

3. The system as claimed in claim 1 wherein fabricating the device element on the wafer comprises fabricating an optical element with the waferscale cap optically transparent.

4. The system as claimed in claim 1 wherein forming the waferscale spacer around the device element comprises forming a dam type waferscale spacer with the waferscale cap for preventing the encapsulant from interfering with the device element.

5. The system as claimed in claim 1 wherein forming the waferscale spacer around the device element comprises forming a step-dam type waferscale spacer with the waferscale cap, on a step of the step-dam waferscale spacer, for preventing the encapsulant from interfering with the device element.

6. A waferscale package system comprising:
   forming a protection structure comprises:
      forming a wafer,
      fabricating a device element on the wafer,
      forming a waferscale spacer around the device element and having a thickness greater than width thereof and greater than the thickness of the device element,
      attaching a waferscale cap to the waferscale spacer to cover the device element, and singulating the wafer to form a number of a semiconductor die;
   attaching a carrier to the protection structure;
   electrically connecting the semiconductor die outside the waferscale spacer to the carrier with bond wires; and
   molding an encapsulant around the protection structure to the carrier.

7. The system as claimed in claim 6 wherein molding the encapsulant around the protection structure to the carrier comprises exposing a top of the waferscale cap.

8. The system as claimed in claim 6 wherein molding the encapsulant around the protection structure to the carrier comprises forming a hermetic seal of the protection structure.

9. The system as claimed in claim 6 wherein forming the wafer comprises forming an optical structure.

10. The system as claimed in claim 6 further comprising attaching electrical interconnects between carrier and bonding pads of the semiconductor die.

11. A waferscale package system comprising:
a protection structure comprises:
a semiconductor die,
a device element on the semiconductor die,
a waferscale spacer around the device element and having a thickness greater than a width thereof and greater than the thickness of the device element, and
a waferscale cap attached to the waferscale spacer to cover the device element;
a carrier attached to the protection structure;
bond wires electrically connecting the wafer outside the waferscale spacer to the carrier; and
an encapsulant around the protection structure to the carrier.

12. The system as claimed in claim 11 wherein the device element on the semiconductor die is a microelectromechanical system element.

13. The system as claimed in claim 11 wherein the device element on the semiconductor die is an optical element with the waferscale cap optically transparent.

14. The system as claimed in claim 11 wherein the waferscale spacer around the device element is a dam type waferscale spacer with the waferscale cap for preventing the encapsulant from interfering with the device element.

15. The system as claimed in claim 11 wherein the waferscale spacer around the device element is a step-dam type waferscale spacer with the waferscale cap, on a step of the step-dam waferscale spacer, for preventing the encapsulant from interfering with the device element.

16. The system as claimed in claim 11 wherein the carrier is a substrate or lead frame.

17. The system as claimed in claim 16 wherein the encapsulant around the protection structure to the carrier comprises a top of the waferscale cap exposed.

18. The system as claimed in claim 16 wherein the encapsulant around the protection structure to the carrier forms a hermetic seal by the encapsulant of the protection structure.

19. The system as claimed in claim 16 wherein the semiconductor die supports an optical structure.

20. The system as claimed in claim 16 further comprising electrical interconnects between carrier and bonding pads of the semiconductor die.

* * * * *